United States Patent [19]

Neudeck et al.

[11] Patent Number: 5,118,634
[45] Date of Patent: Jun. 2, 1992

[54] SELF-ALIGNED INTEGRATED CIRCUIT BIPOLAR TRANSISTOR HAVING MONOCRYSTALLINE CONTACTS

[75] Inventors: Gerold W. Neudeck, West Lafayette; Jack L. Glenn, Jr., Lafayette, both of Ind.

[73] Assignee: Purdue Research Foundation, West Lafayette, Ind.

[21] Appl. No.: 588,613

[22] Filed: Sep. 26, 1990

[51] Int. Cl.$^5$ .................... H01L 21/265; H01L 29/70
[52] U.S. Cl. ............................ 437/31; 148/DIG. 11; 357/34; 357/56
[58] Field of Search ...................... 437/31, 89; 357/34, 357/56; 148/DIG. 11

[56] References Cited

U.S. PATENT DOCUMENTS

| | | |
|---|---|---|
| 4,243,435 | 1/1981 | Barile et al. |
| 4,433,470 | 2/1984 | Kameyama et al. |
| 4,508,579 | 4/1985 | Goth et al. |
| 4,573,256 | 3/1986 | Lechaton et al. |
| 4,764,799 | 8/1988 | Malaviya |
| 4,829,016 | 5/1989 | Neudeck |
| 4,844,371 | 7/1989 | Hansen et al. ........................ 437/82 |
| 4,927,774 | 5/1990 | Welbourn et al. |

FOREIGN PATENT DOCUMENTS 1-232755  9/1989  Japan.

OTHER PUBLICATIONS

*A New Epitaxy Technique for Device Isolation and Advanced Device Structures*, P. Schubert and G. Neudeck, School of Electrical Engineering, Purdue University, W. Lafayette, Ind.
*Confined Lateral Selective Epitaxial Growth of Silicon for Device Fabrication*, P. Schubert and G. Neudeck, IEEE Electron Device Letters, vol. 11, No. 5, May 1990, pp. 181-183.
*Three-Dimensional MOS Process Development*, J. Freidrich and G. Neudeck, School of Electrical Engineering, Purdue University, TR-FR 89-7, Feb. 1989.
*A New Epitaxial Lateral Overgrowth Silicon Bipolar Transistor*, G. W. Neudeck, IEEE Electron Device Letters, vol. EDL-8, No. 10, Oct. 1987, pp. 492-495.
*Self-Aligned Bipolar NPN Transistor with 60 nm Epitaxial Base*, J. N. Burghartz et al., IEEE, Jul. 1989, pp. 229-232.
*Interface Characterization of Silicon Epitaxial Lateral Growth over Existing SiO$_2$ for Three-Dimensional CMOS Structures*, J. A. Friedrich, G. W. Neudeck, IEEE Electron Device Letters, vol. 10, No. 4, Apr. 1989, pp. 144-146.
*Thermal Oxidation of Heavily Doped Silicon*, B. E. Deal and M. Sklar, Journal of the Electrochemical Society, vol. 112, No. 4, Apr. 1965, pp. 430-435.
*Basic: An Advanced High-Performance Bipolar Process*, J. van der Velden et al., IEEE, Jul. 1989, pp. 233-236.
*A Lateral Silicon-on-Insulator Bipolar Transistor with a Self-Aligned Base Contact*, J. C. Sturm et al., IEEE Electron Device Letters, vol. EDL-8, No. 3, Mar. 1987, pp. 104-106.
*Selective Epitaxial Growth Silicon Bipolar Transistors for Material Characterization*, James W. Siekkinen et al., IEEE Transactions on Electron Devices, vol. 35, No. 10, Oct. 1988, pp. 1640-1644.

Primary Examiner—Olik Chaudhuri
Assistant Examiner—Long Pham
Attorney, Agent, or Firm—Bell, Seltzer, Park & Gibson

[57] ABSTRACT

An integrated circuit vertical bipolar transistor includes monocrystalline emitter, base and collector contacts for electrically contacting the transistor's emitter, base and collector regions, respectively. The collector, base contact and emitter contact are preferably insulated from one another by oxide regions which are formed from the monocrystalline collector and monocrystalline base contacts. Since all of the contacts are formed of monocrystalline material and the oxide isolation is formed from monocrystalline material, high performance devices are formed.

The process of forming the transistor self aligns the base to the collector and the emitter to the base. The monocrystalline base contact is also self aligned to the base and the monocrystalline emitter contact is self aligned to the emitter. The process preferably uses epitaxial lateral overgrowth and selective epitaxial growth from a mesa region to form the monocrystalline contacts. A shallow phosphorus implant into the base contact is used to preferentially grow the oxide between the base contact and emitter contact.

16 Claims, 9 Drawing Sheets

SELF-ALIGNED INTEGRATED CIRCUIT BIPOLAR TRANSISTOR HAVING MONOCRYSTALLINE CONTACTS

FIELD OF THE INVENTION

This invention relates to integrated circuit bipolar transistors, and more particularly to an integrated circuit bipolar transistor having monocrystalline contacts, and which is formed by a process that self-aligns critical components thereof to one another.

BACKGROUND OF THE INVENTION

As the demand for high performance microelectronic devices increases, there is a continued need for more compact, higher speed integrated circuit devices such as bipolar transistors. Moreover, there is a continued need for high performance integrated circuit contacts to these devices which do not degrade the inherent performance of the high speed, compact devices.

Compact devices with high speed performance may be fabricated using "self-aligned" processes. In a self-aligned process, at least one device region is used as an alignment guide for forming a second region, thereby eliminating or reducing alignment registration errors produced by equipment tolerances. Examples of integrated circuit bipolar transistors formed by self-aligned processes may be found in U.S. Pat. No. 4,927,774 to Welbourn et al. entitled *Self Aligned Bipolar Fabrication Process;* in a publication entitled *High Speed Bipolar ICs Using Super Self-Aligned Process Technology* to Sakai et al. published in the Japanese Journal of Applied Physics, Vol. 20, Supplement 201, pp. 155-159 (1981); and in a publication entitled *A 30-ps Si Bipolar IC Using Super Self-Aligned Process Technology* to Konaka et al. published in the IEEE Transactions on Electron Devices, Vol. ED-33, No. 4, pp. 526-531, Apr. 1986. Many other examples of self-aligned bipolar transistor fabrication processes may be found.

Operating speed of bipolar transistors may also be improved by reducing the parasitic components within the device. Typically, the most significant parasitic components include the base-collector capacitance, the emitter-base capacitance, the collector to substrate capacitance and the base resistance. In order to reduce the parasitic components, virtually all high speed integrated circuit bipolar transistors use heavily doped polycrystalline silicon (polysilicon) to form the base contact, also referred to as the "extrinsic base", and the emitter contacts of the devices. The polysilicon base contact and emitter contact are typically isolated from one another using a silicon oxide layer thermally grown from the polysilicon. Examples of bipolar transistors using polysilicon contacts are found in U.S. Pat. No. 3,600,651 to Duncan entitled *Bipolar and Field-Effect Transistor Using Polycrystalline Epitaxial Deposited Silicon;* U.S. Pat. No. 4,495,010 to Kranzer entitled *Method for Manufacturing Fast Bipolar Transistors;* U.S. Pat. No. 4,523,370 to Sullivan et al. entitled *Process for Fabrication a Bipolar Transistor with a Thin Base and an Abrupt Base-Collector Junction;* and U.S. Pat. No. 4,933,737 to Nakamura et al. entitled *Polysilicon Contaots to IC Mesas;* and in a publication entitled *A Self-Aligning Polysilicon Electrode Technology (SPEL) for Future LSIS* to Misawa et al. published in IEDM 87 pp. 32-35 (*1987*).

Unfortunately, when using polysilicon base and emitter contacts, the extrinsic base and emitter resistances are dependent upon the quality of the polysilicon material. As is well known to those having skill in the art, it is difficult to obtain high quality polysilicon material because of the difficulty in controlling grain size, impurity diffusion, resistivity and oxide trapping. Similarly, the integrity and long term stability of the polysilicon base and emitter contact regions is dependent upon the formation of reproducible, low-leakage polysilicon-oxide insulators. In addition, polysilicon has a much lower carrier mobility, and therefore a larger resistance, than does single crystal silicon.

Attempts have been made to substitute monocrystalline (single crystal) silicon for polysilicon in bipolar transistors to improve the performance thereof. For example, IBM Technical Disclosure Bulletin Vol. 28, No. 1, June 1985 pages 200-201 entitled *Substitution of Single Crystalline Silicon for Polysilicon in Transistor Manufacture,* describes a single crystal silicon base contact. An article by S.J. Duey and co-inventor G. W. Neudeck entitled *A Novel Quasi-Dielectrically Isolated Bipolar Transistor Using Epitaxial Lateral Overgrowth,* IEEE 1988 Bipolar Circuits and Technology Meeting, page 241, describes a power bipolar transistor which uses epitaxial lateral overgrowth to form a transistor which has a monocrystalline collector contact. Emitter and base contacts are not included. Rather, the emitter and base directly contact the emitter and base electrodes. Junction isolation is used to isolate the base and emitter and the emitter and collector.

In summary, the art has yet to produce a compact integrated circuit bipolar transistor which includes monocrystalline contacts for the base, emitter and collector. The art has also not provided a self-aligned process for forming such a transistor.

SUMMARY OF THE INVENTION

It is therefore an object of the invention to provide a compact, high-performance integrated circuit bipolar transistor and method of forming same.

It is another object of the invention to provide self-aligned methods for forming a compact, high performance integrated circuit bipolar transistor.

It is still another object of the present invention to provide an integrated circuit bipolar transistor which eliminates polysilicon contacts in favor of monocrystalline contacts for the base, emitter and collector thereof.

These and other objects are provided according to the present invention by an integrated circuit vertical bipolar transistor including laterally extending base, emitter, and collector regions which are vertically stacked on one another. The vertical bipolar transistor also includes a monocrystalline collector contact for electrically contacting the monocrystalline collector, a monocrystalline base contact for electrically contacting the monocrystalline base and a monocrystalline emitter contact for electrically contacting the monocrystalline emitter. The base region is a very small region sandwiched between the collector and emitter and the monocrystalline base contact electrically contacts the side of the base.

The vertical bipolar transistor of the present invention also includes first and second insulating layers, with the first insulating layer being located between the monocrystalline collector and the monocrystalline base contact, for electrically isolating the monocrystalline collector and the monocrystalline base contact from one another. The second insulating layer is located between the monocrystalline base contact and the monocrystalline emitter contact, for electrically isolating the monocrystalline emitter contact and the monocrystalline base contact from one another. Metal or other electrodes are also provided for electrically contacting the monocrystalline emitter contact, monocrystalline base contact and monocrystalline collector contact. The first and second insulating layers are preferably formed of an oxide of the monocrystalline collector and the monocrystalline base contact, respectively.

The bipolar transistor structure of the present invention provides a compact, vertical bipolar transistor with a very thin and narrow base region to provide high performance. In particular, parasitic capacitances between the base and collector, between the emitter and base, and between the collector and substrate are greatly reduced because the base and collector can be made narrow. Moreover, all of the contacts are formed of monocrystalline silicon which exhibits vastly improved characteristics over heretofore used polysilicon contacts. In particular, the single crystal base contact dramatically decreases the base resistance, thereby dramatically increasing device speed. Finally, since the oxide isolation between the collector and base contact and base contact and emitter contact may be formed of an oxide of monocrystalline semiconductor material, high performance devices are formed.

According to another aspect of the present invention, the high performance integrate circuit bipolar transistor is formed in self-aligned processes. In particular, the process self-aligns the base to the collector and the emitter to the base. Moreover, the monocrystalline base contact is self-aligned to the base and the monocrystalline emitter contact is self-aligned to the emitter. Accordingly, the critical device dimensions are formed in a self-aligned manner to thereby reduce equipment tolerances. Self alignment may be accomplished using a single mask level to define the critical features, thereby eliminating registration errors.

In particular, according to the present invention, the integrated circuit bipolar transistor is formed by forming a monocrystalline mesa on a monocrystalline substrate, with the mesa having a wall rising above the substrate, and a mesa top. The monocrystalline substrate may be, for example, a conventional substrate, a monocrystalline tub in a substrate, or an expitaxial layer formed on a semiconductor substrate using a number of well-known techniques. A plug is then formed on the mesa top surface with the plug covering a first portion of the mesa top surface but leaving a second portion of the mesa top surface exposed. The plug includes a plug wall which rises above the mesa top surface and a plug top surface. The plug and mesa may be formed using one mask level to eliminate critical alignment tolerances.

A first insulating layer is then formed on the mesa wall and on the substrate adjacent the mesa wall. Then, a first monocrystalline contact is grown from the exposed second portion of the mesa top surface with the first monocrystalline contact having a first contact side extending along the plug wall and having a first contact top surface extending along the first insulating layer. The first monocrystalline contact is preferably formed using epitaxial lateral growth of monocrystalline silicon. Typically, it forms the base contact.

The plug is then removed to expose the first portion of the mesa top and the first contact side, and a second insulating layer is formed along the first contact side and the first contact top with the first portion of the mesa top remaining exposed. Finally, a second monocrystalline contact is formed from the first portion of the mesa top using a selective epitaxial growth process, with the second monocrystalline contact extending along the second insulating layer. The second monocrystalline contact is typically the emitter contact. A third monocrystalline contact may also be formed from the monocrystalline substrate, preferably simultaneously with the forming of the second contact. The third contact is typically the collector contact. Electrodes may then be formed to connect to the first, second and third monocrystalline contacts.

Preferably, the second insulating layer is formed along the first contact side and the first contact top while leaving the first portion of the mesa top exposed, by first forming an oxide on the first contact side and the first contact top and on the exposed first portion of the mesa top, with the oxide being thinner on the mesa top than on the base contact top. This oxide is then directionally etched to remove the thinner oxide on the mesa top while allowing at least a portion of the oxide on the base contact top and side to remain. The oxide which is thinner on the first portion of the mesa top than on the first contact side and top may be formed by doping the first contact with a dopant that accelerates the growth of an oxide on the base contact top. For example, a shallow phosphorus doping implant may be used on the first contact top. The plug protects the dopant from being introduced in the mesa top. The first contact is then oxidized so that the first contact top grows oxide much thicker than the oxide on the mesa top.

The process of the present invention forms the plug on the mesa, and then all subsequent steps use this plug for alignment. Accordingly, critical alignment steps are eliminated because the base is self-aligned to the collector, the emitter is self-aligned to the base, the base contact is self-aligned to the base and the emitter contact is self-aligned to the emitter. An extremely compact device is thereby formed. Moreover, the process of the present invention preferably forms the first and second insulating layers from oxide of the monocrystalline collector region and base contact region, respectively, thereby providing a high-quality insulating layer between the monocrystalline base contact, the collector and monocrystalline emitter contact regions. The performance degradation produced by polysilicon may thereby be reduced.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Referring now to FIG. 1, a method of forming an integrated circuit bipolar transistor according to the present invention will now be described. The integrated bipolar transistor is self-aligned because the base, emitter and collector are vertically stacked and self-aligned to one another, and the base, emitter and collector contacts are self-aligned to one another. As will be described below, the base, emitter and collector contacts may be formed by epitaxial lateral overgrowth of single crystal silicon on silicon dioxide. Impurity enhanced oxidation of silicon is used to achieve self-alignment of the emitter. The device includes a low resistance type base contact having a measured sheet resistance five times lower than has been typically reported and 2.5 times lower than the lowest reported sheet resistance.

In general, the method described in FIG. 1 forms a single crystal silicon mesa on a monocrystalline silicon substrate, with the mesa having a mesa wall rising above the monocrystalline substrate and a mesa top surface. A plug is then formed on the mesa top surface with the plug covering the first portion of the mesa top surface and leaving a second portion of the mesa top surface exposed. The plug includes a plug wall rising above the mesa top surface and a plug top surface. The plug and mesa may be formed using only a single critical masking step. A first insulating layer is then formed on the mesa wall and on the substrate adjacent the mesa wall, preferably by oxidizing the monocrystalline mesa and the substrate. Then, a monocrystalline base contact is formed from the second portion of the mesa top surface, preferably using an epitaxial lateral overgrowth technique. The base contact has a side extending along the plug wall and a base contact top surface extending along the first insulating layer. The plug is then removed to thereby expose the first portion of the mesa top and to expose the base contact side.

A second insulating layer is then formed along the base contact side and the base contact top with the first portion of the mesa top remaining exposed. This insulating layer is preferably formed by forming an oxide on the base contact side and base contact top and on the exposed first portion of the mesa top, with the oxide being thinner on the mesa top than on the base contact top. This oxide may be formed by performing a shallow phosphorus implant on the epitaxial laterally grown silicon before the plug is removed. The phosphorus implant causes the implanted silicon to oxidize at a faster rate. Then, the oxide is directionally etched to remove the thin oxide on the mesa top with at least a portion of the oxide on the base contact top and side remaining. Finally, a second monocrystalline contact is formed from the first portion of the mesa top extending along the second insulating layer. A third monocrystalline contact may also be formed simultaneously. Metal electrodes are then formed on each of the contacts.

Figure 1A:
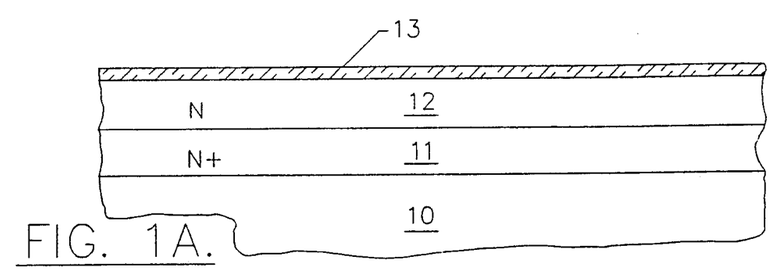
FIGS. 1A–1V illustrate steps for forming a transistor according to the present invention.

Referring now to FIG. 1A, processing begins by forming a monocrystalline mesa on a monocrystalline substrate. The monocrystalline substrate may be a conventional N+ buried layer 11 which is used to form a subcollector, and which is typically formed on a semiconductor substrate 10. It will be understood by those having skill in the art, however, that substrate 10 may be an epitaxial tub on a semiconductor substrate, a thin semiconductor-on-insulator layer, or any other semiconductor layer which can form the substrate foundation for a semiconductor device. To form an NPN device, the buried layer is typically doped with arsenic. It will be understood that PNP devices may also be formed. An N doped collector region 12 is then epitaxially grown on the N+subcollector 11. A 20 nm pad oxide 13, for example 20 nm thick, is then grown, for example, by oxidizing the collector region 12.

Figure 1B:
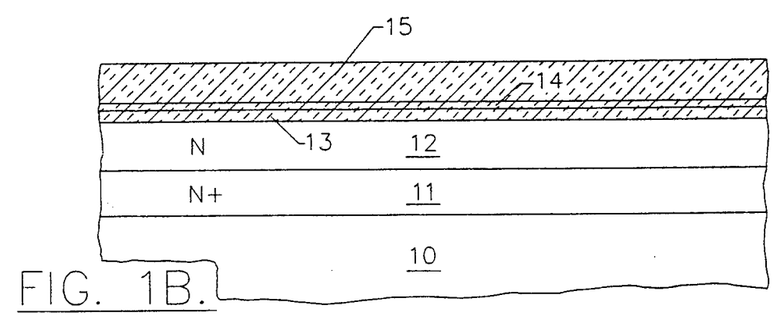

Referring now to FIG. 1B, a silicon nitride or other insulator layer 14 is deposited on silicon dioxide layer 13. Then, low temperature silicon dioxide layer 15 approximately 600 nm thick, is formed on silicon nitride layer 14.

Figure 1C:
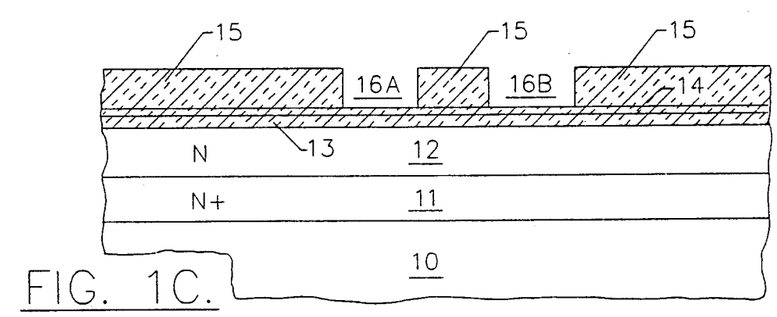

Referring to FIG. 1C, reactive ion etching or other directional etching may be used to open windows 16A and 16B in the oxide layer 15. It will be understood by those having skill in the art that windows 16A and 16B may be defined using a single mask level so that no registration errors are present. As will be seen from the description below, the location and dimensions of windows 16A and 16B determine the registration and dimensions of subsequent regions, providing self alignment of subsequent regions.

Figure 1D:
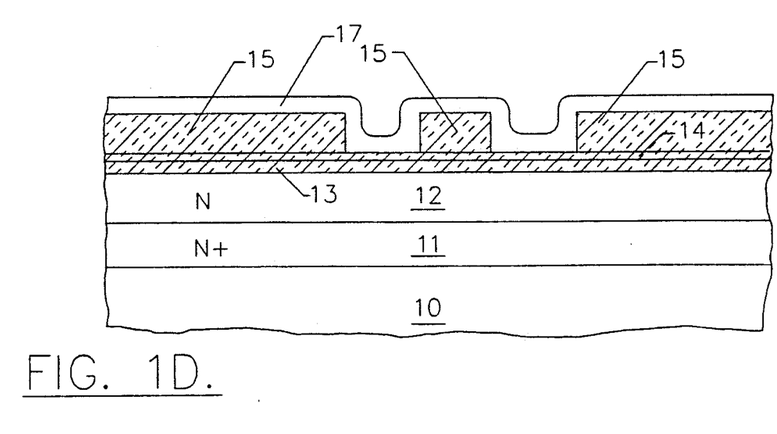
Figure 1E:
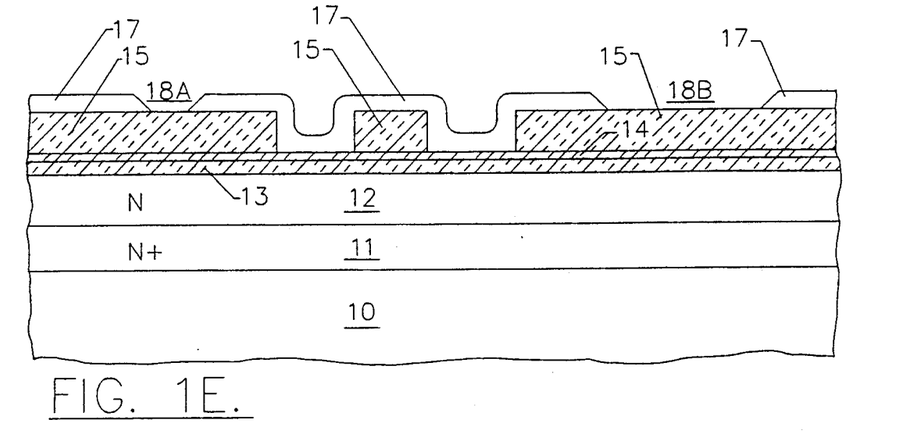
Figure 1F:
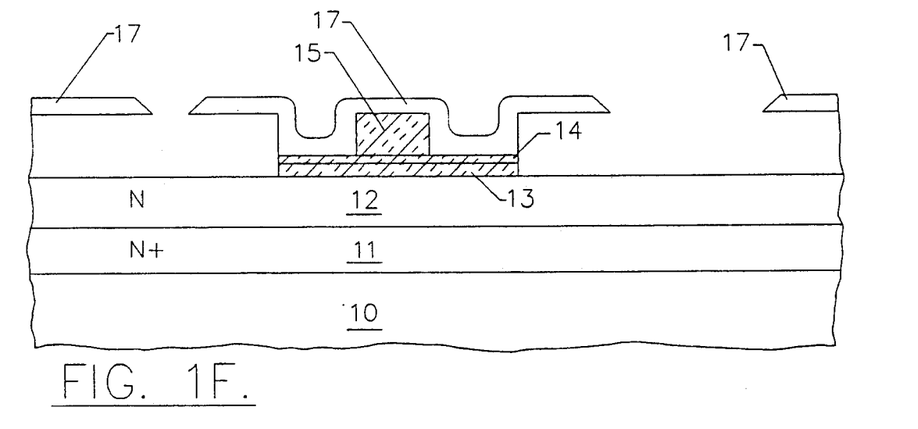
Figure 1G:
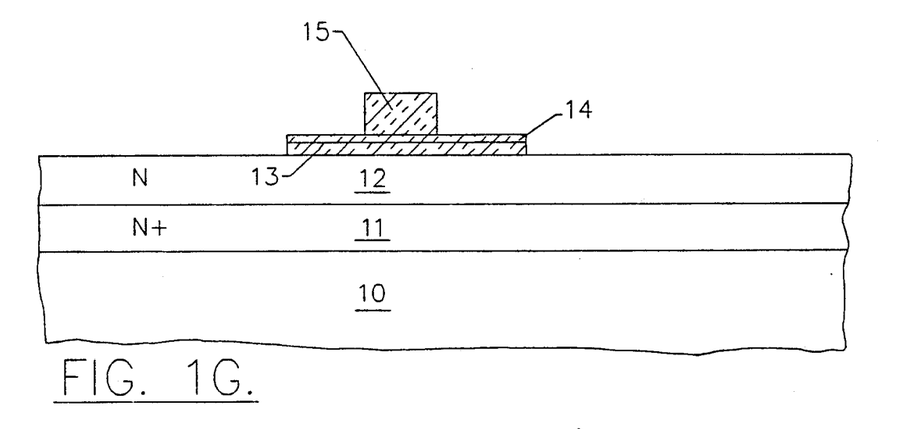

Referring now to FIG. 1D, polycrystalline silicon (polysilicon) or other material 17 is deposited conformally along the exposed portion of the low temperature oxide layer and in the windows 16A and 16B. Then, referring to FIG. 1E, a second pair of windows 18A and 18B are opened in the polysilicon layer 17. The alignment of windows 18A and 18B to windows 16A and 16B is not a critical dimension because windows 18A and 18B are not part of the final device. In FIG. 1F, the low temperature oxide layer 15, the silicon nitride layer 14 and the pad oxide layer 13 under the polysilicon layer 17 which is opened by the windows 18A and 18B are removed, for example by successive wet etches, to expose the substrate. Then, as shown in FIG. 1G, the remainder of polysilicon layer 17 is removed, for example by wet etching. Finally, referring to FIG. 1H, the collector 12 is directionally etched down to or close to the N buried layer, using reactive ion etching or other known techniques.

Figure 1H:
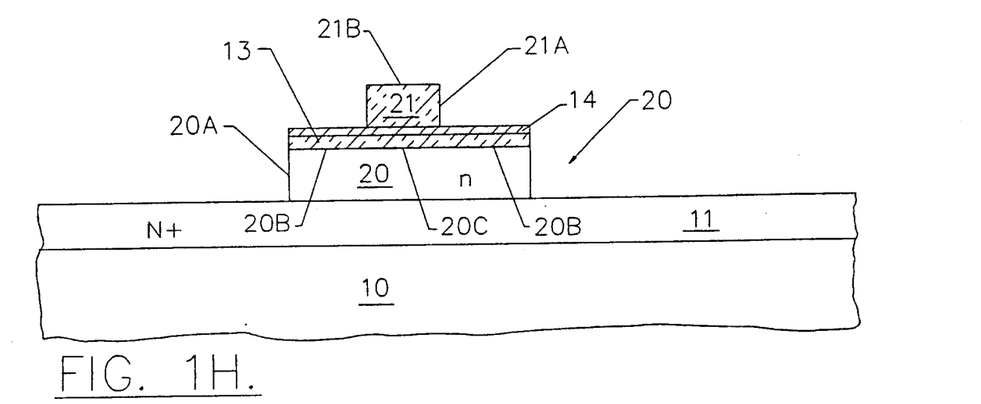

As shown in FIG. 1H, the structure formed is a monocrystalline mesa 20 on the monocrystalline substrate 11. The mesa includes a mesa Wall 20A and the mesa top surface 20B and 20C. A barrier layer, comprising oxide pad layer 13 and nitride layer 14 covers the entire mesa top surface 20B and 20C. A plug 21 has been formed on the mesa top surface, with the plug covering a first portion 20C of the mesa top surface leaving a second portion 20B of the mesa top surface exposed. The plug 21 has a plug wall 21A rising above the mesa top surface and a plug top surface 21B. It will be understood by those having skill in the art that many other techniques for forming the mesa and plug shown in FIG. 1H may be used.

Figure 1I:
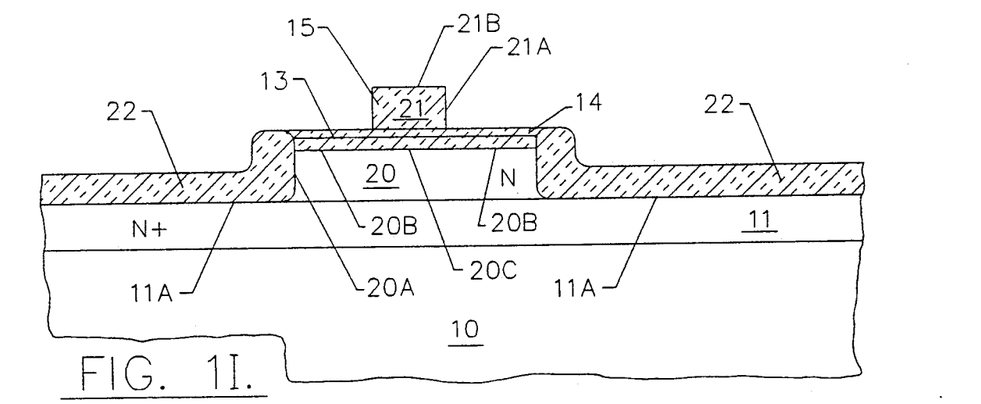
Figure 1J:
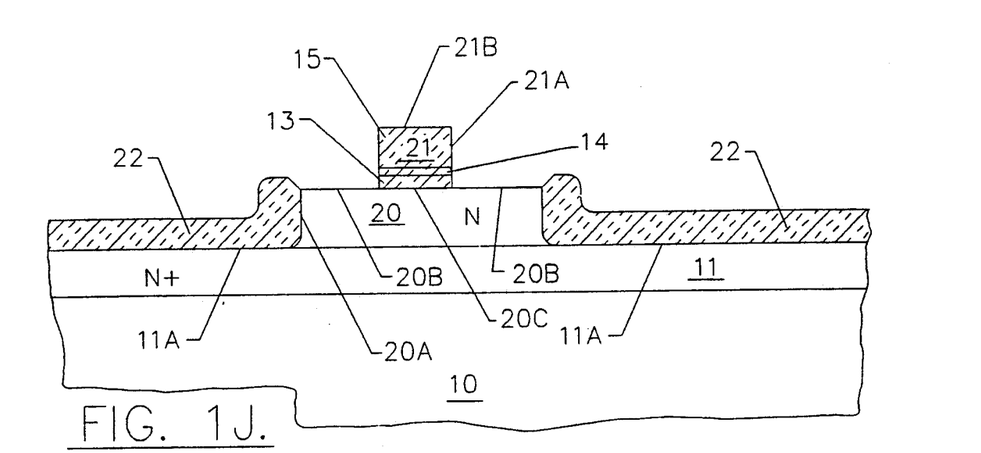
Figure 1K:
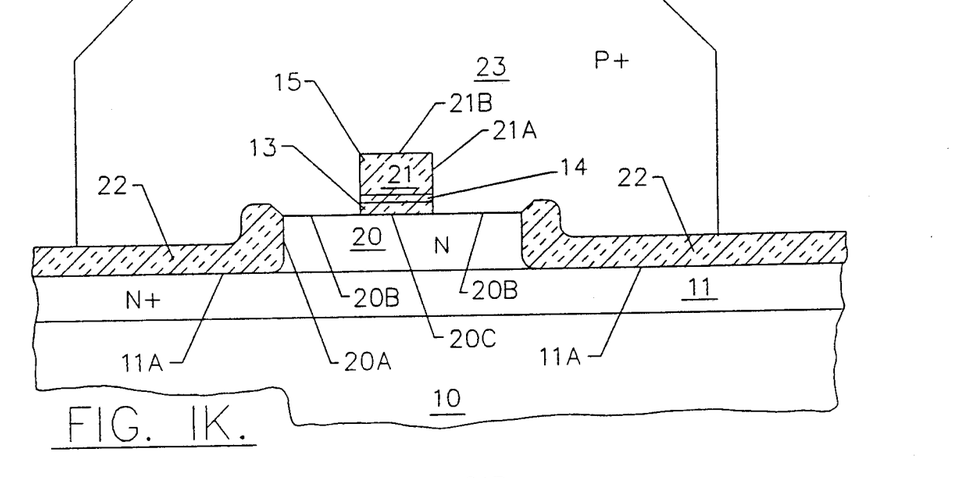

Then, referring to FIG. 1I, the exposed surface 11A of silicon layer 11 and the wall 20A of silicon mesa 22 are oxidized in order to form a first insulating layer 22. It will be understood by those having skill in the art that since the first insulating layer 22 is formed from an oxide of single crystal silicon (layer 11 and mesa 20), a high quality insulating layer 22 is formed. Referring now to FIG. 1J, the exposed portions of nitride layer 14 and oxide pad layer 13 on the exposed surfaces 20B of mesa 20 are removed, for example by wet etching, to expose the second portion 20B of mesa 20. Then, the exposed second portion 20B is used as a seed for epitaxial lateral overgrowth of silicon using for example, a reduced pressure chemical vapor deposition pancake type reactor. The epitaxial lateral growth of silicon is well known to those having skill in the art and is described for example in an article by Friedrich and coinventor Neudeck entitled Interface Characterization of *Silicon Epitaxial Lateral Growth Over Existing SiO$_2$ for Three-Dimensional CMOS Structures*, IEEE Electron Device Letters, 1989, Vol. 10, pp. 144-146, the disclosure of which is hereby incorporated herein by reference. The epitaxial lateral overgrowth of silicon results in an epitaxial lateral single crystal silicon layer 23 shown in FIG. 1K. It will be understood by those having skill in the art that other epitaxy techniques may be used.

Figure 1L:
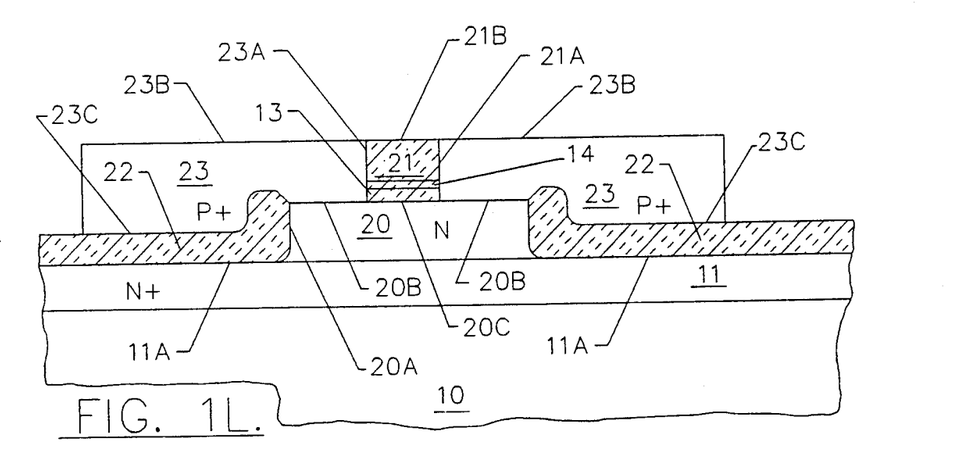

Referring now to FIG. 1L the epitaxial lateral overgrown silicon layer 23 is planarized down to the top 21B of mesa 21 using chemical/mechanical planarization or other known techniques. Chemical/mechanical planarization techniques are well known to those having skill in the art and are described in an article by Davari et al. entitled *A New Planarization Technique, Using a Combination of RIE and Chemical Mechanical Polish (CMP)*, published in International Electron Devices Meeting 1989 Technical Digest, Dec., 1989, pp. 61-64. It will also be understood by those having skill in the art that confined lateral selective epitaxial growth may be used to grow base contacts in oxide lined cavities, avoiding the need for chemical mechanical planarization or other etching techniques, to obtain the structure of FIG. 1L. Confined lateral selective epitaxial growth (CLSEG) is described in an article by Schubert and coinventor Neudeck entitled *Confined Lateral Selective Epitaxial Growth of Silicon for Device Fabrication*, IEEE Electron Device Letters, May 1990, Vol. 11, No. 5, pp. 181-183, the disclosure of which is hereby incorporated herein by reference.

The single crystal silicon layer 23 of FIG. 1L forms the base contact and has a base contact side 23A which extends along the plug wall, and a base contact top layer 23B and a base contact bottom layer 23C which extend along the first insulating layer 22. It will be understood by those having skill in the art that base contact 23 of FIG. 1L is self-aligned to the plug 21 and to the mesa 20. As will later be seen, this self-alignment will also cause the base contact to be self-aligned to the base region, even though the base region of the transistor has not yet been formed. Moreover, the base contact region 23 is a single crystal layer thereby providing low base contact resistance.

Figure 1M:
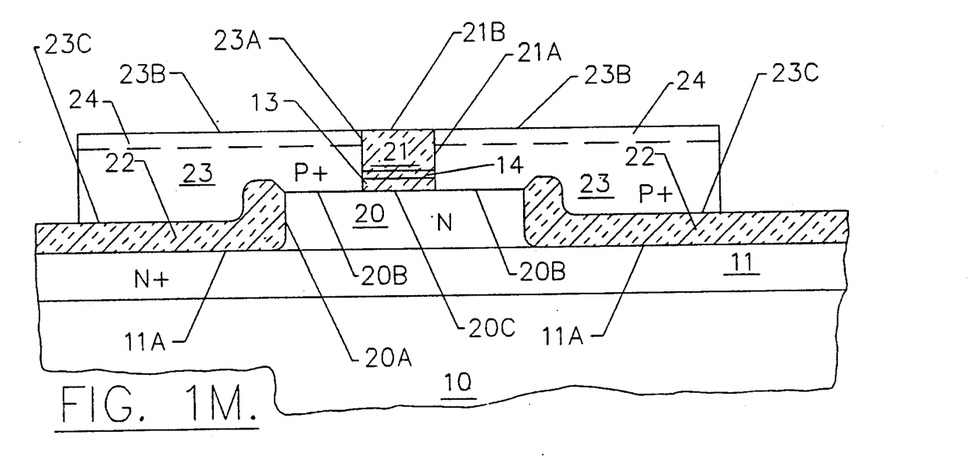

Referring now to FIG. 1M, self-alignment of the emitter is now provided by ion implanting the exposed base contact region 23B with a moderate dose of phosphorus and a heavy dose of boron. Both implants may be performed simultaneously, and of course, other dopants may be used. The boron implant is a deep boron implant which dopes the base contact layer 23 P+. The shallow phosphorus implant, represented in FIG. 1M by implanted layer 24 will be used to cause the silicon layer 23 which has been implanted with phosphorus 24 to oxidize more rapidly than undoped portions of silicon layer 25 as will be described below. Preferential growth of an oxide layer will thereby be achieved.

Figure 1N:
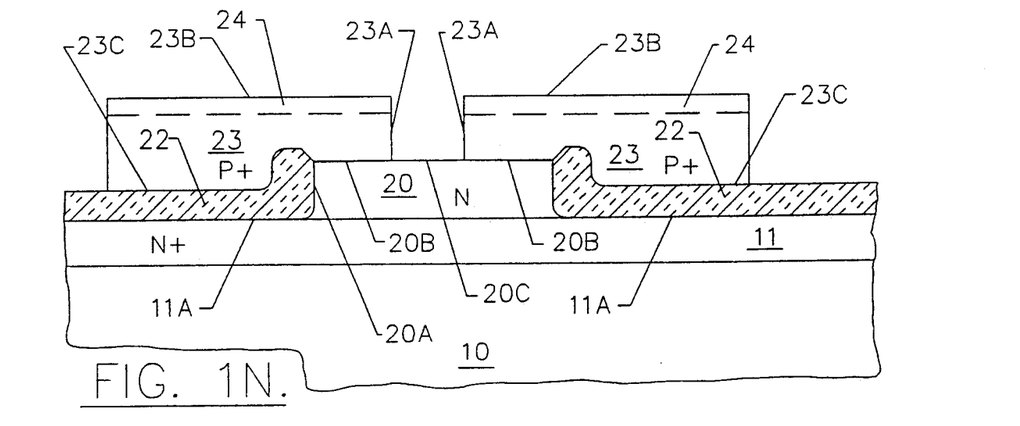
Figure 1O:
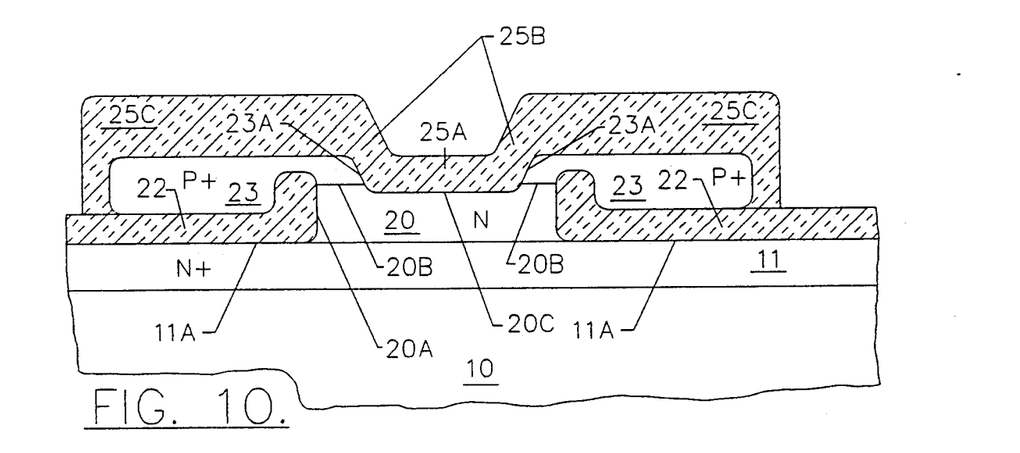
Figure 1P:
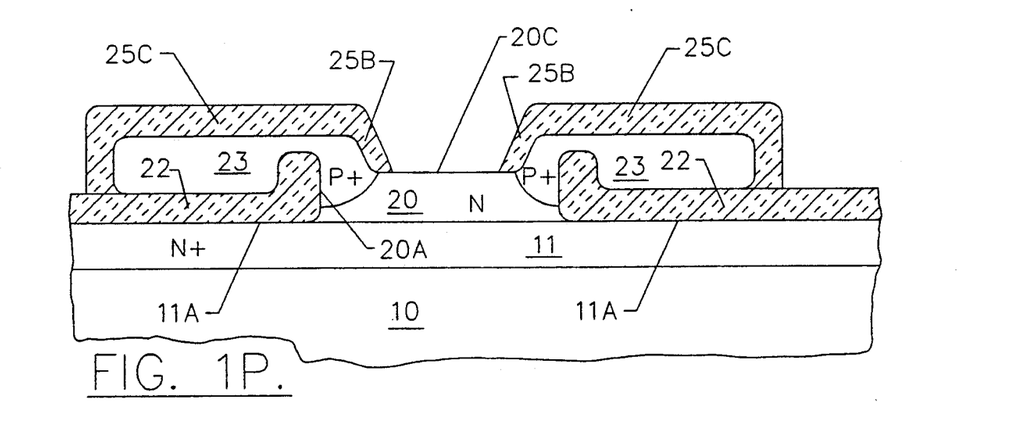

After implantation, the plug 21 and the underlying silicon nitride layer 14 and pad oxide layer 13 are removed for example by wet etching, as shown in FIG. 1N. Then, as shown in FIG. 1O, the wafer is oxidized at low temperature (for example 850° C.), in a wet oxygen atmosphere, to produce about 230 nm of silicon dioxide 25A on the top surface of mesa 20C and about 230 nm of silicon dioxide 25B on the side 23A of base contact 23. However, due to the presence of the shallow implanted phosphorus layer 24 on the top surface 23B of the base contact, a substantially thicker oxide 25C, on the order of 500-600 nm, is grown on the top surface of the base contact 23B. The enhanced growth of silicon dioxide in a phosphorus doped silicon surface is described in a publication to Deal et al. entitled *Thermal Oxidation of Heavily Doped Silicon* published in the Journal of the Electrochemical Society Vol. 112, 1965, pp. 430-435.

Accordingly, a high quality silicon dioxide layer 25 is created to form the second insulating layer of the structure, with the second insulating layer being thicker on the top surface of the base contact than on the side of the base contact or on the top of the mesa. This allows for maskless vertical etching, such as reactive ion etching, to remove the portion 25A of the oxide layer 25 without exposing the top surface 23B or the sidewall 23A of the base contact 23. The top surface 20C of mesa 20 is now exposed, as shown in FIG. 1P.

Figure 1Q:
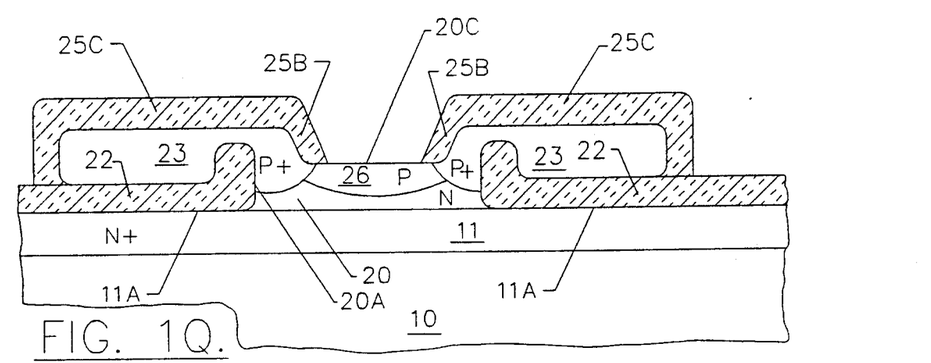
Figure 1R:
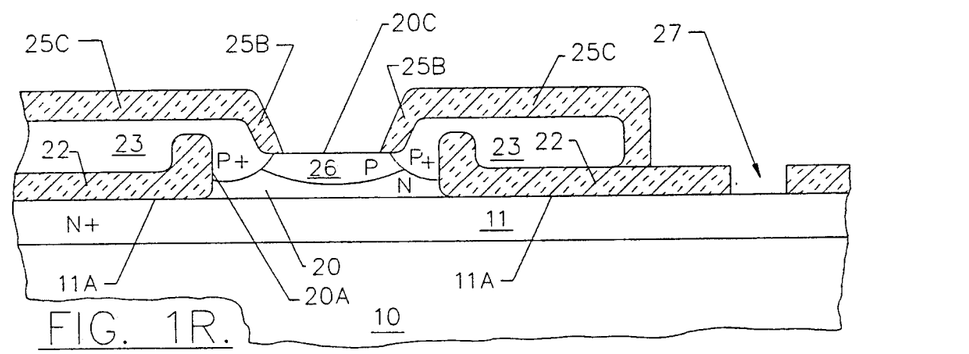
Figure 1S:
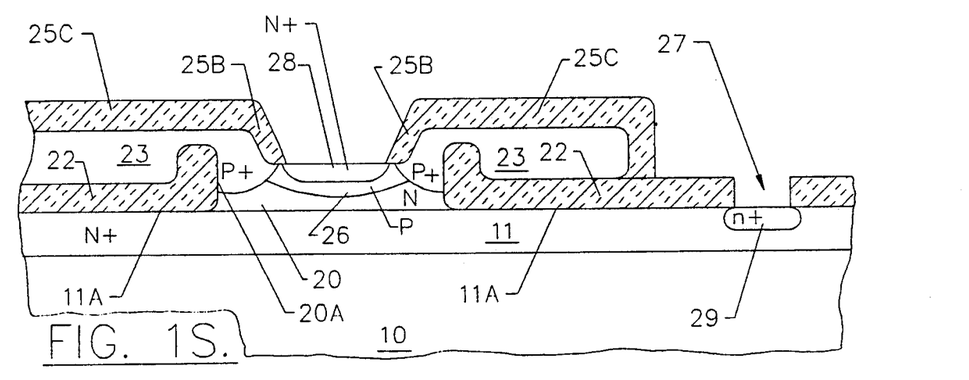
Figure 1T:
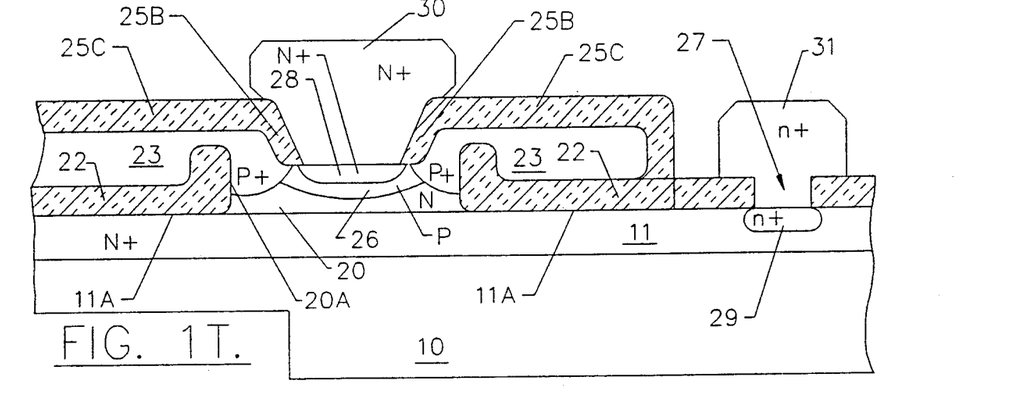

Referring now to FIG. 1Q, the exposed portion 20C of mesa 20 is then implanted with boron or other suitable dopant to form the intrinsic base region 26. Then, referring to FIG. 1R, a contact hole 27 is opened in layer 22 outside the base contact region 23. In FIG. 1S the intrinsic emitter 28 and collector contact link-up 29 are formed, for example, by implantation of arsenic.

Then, as shown in FIG. 1T in situ doped, low resistance N type emitter and collector contacts, 30 and 31 respectively, are grown, for example, by selective epitaxial growth of silicon. It Will be understood by those having skill in the art that in situ doped N type emitter contact 30 may also form the emitter region 28 so that a separate emitter forming step need not be performed.

Figure 1U:
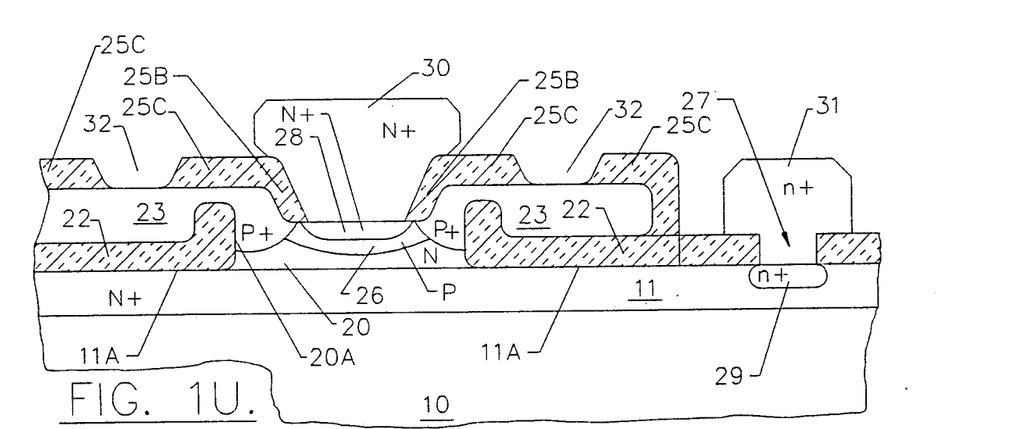

Then, referring to FIG. 1U, one or more base contact holes 32 are etched in the second insulating layer 25C. Finally, as shown in FIG. 1V, electrode metallization for the base, emitter and collector electrodes 33, 34, and 35 respectively are formed of aluminum, aluminum silicide or other materials according to well known techniques.

Figure 1V:
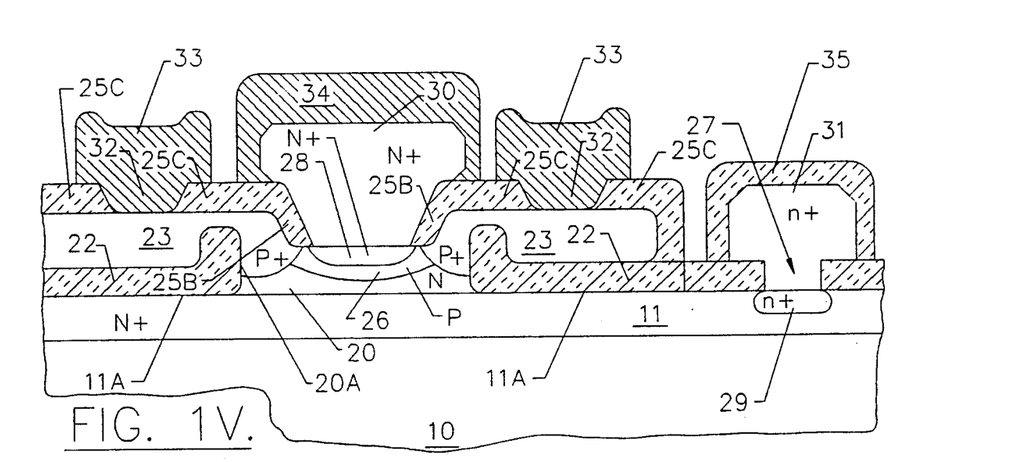

Referring to the completed structure shown in FIG. 1V, it may be seen that the transistor of the present invention comprises an integrated circuit transistor including a lightly doped collector 20, formed out of the remainder of the mesa, and a heavily doped buried subcollector 11 and a collector contact link-up 29 and a collector contact 31, all of which may be formed from single crystal silicon. Similarly, the intrinsic base region 26 and base contact 23 are formed of single crystal silicon. The emitter 28 and the emitter contact 30 are similarly formed of single crystal silicon. Low contact resistance is thereby Moreover, the first insulating layer 22 and the second insulating layer 25 are both grown from single crystal silicon thereby providing improved transistor properties.

It may also be seen that the base 26 is self-aligned to collector 20 and the emitter 22 is self-aligned to the base 26. The base contact 23 connects to the side of base 26 and is self-aligned thereto. Accordingly, a fully self-aligned, all single crystal, vertical bipolar transistor with oxides grown from single crystal material for isolation, is obtained. It will also be seen that the process described in FIGS. 1A-1V only required seven photolithography steps with the first being shown in FIG. 1A, the second in FIG. 1C, the third in FIG. 1E, the fourth in FIG. 1N, the fifth in FIG. 1S, the sixth in FIG. 1U, and the seventh in FIG. 1V.

The bipolar transistor of the present invention provides a single crystal extrinsic base contact having dramatically reduced base resistance. High base resistance is often a critical parasitic which limits device speed. The present invention dramatically reduces this critical parasitic. Moreover, the self aligned process uses only a single mask step to determine all subsequent critical alignments. Accordingly, the base and collector can be made narrow, thereby decreasing the collector-base parasitic capacitance and the collector substrate parasitic capacitance.

Each of the individual process steps described in FIG. 1 are conventional semiconductor processing steps which may be performed in a reliable and repeatable manner. The two most critical steps in the process of FIG. 1 would appear to be isolating the base and emitter contacts with a single crystal grown oxide layer as shown in FIG. 1P, and creating a fully P type low-resistance base contact as shown in FIG. 1O. The feasibility of reliably and repeatedly performing both of these steps has been verified by experimental test structures, as will now be described.

Figure 2:
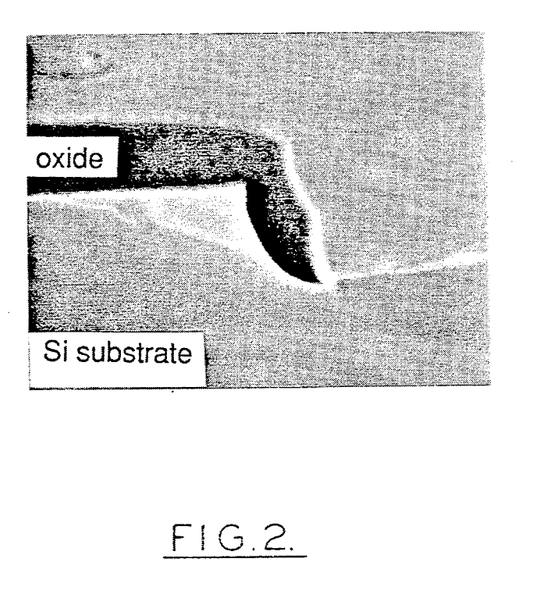
FIG. 2 is a scanning electron micrograph of the base contact of FIG. 1.

In particular, FIG. 2 illustrates a scanning electron micrograph of a large area base contact after oxidation and reactive ion etching processing. In FIG. 2, the portion labelled "oxide" corresponds to layers 25B and 25C in FIG. 1P. The portion labelled "Si substrate" corresponds to the layer 20. The "oxide" layers 25B and 25C were formed by implanting 25 KEV of phosphorus at a dose of $9 \times 10^{15}/cm^2$ and 95 KEV boron at a dose of $4 \times 10^{16}/Cm^2$. After oxidation at 850° C. in wet oxygen for five hours, the oxide thickness on top of the base contact was 530 nm while the oxide thickness on the contact sidewall and in the emitter trench was 230 nm. As shown in FIG. 2, after reactive ion etching a continuous oxide layer of 200-300 nm in thickness remained over the entire base contact, while oxide over the top surface 20C were completely removed. Accordingly, a non-shorting, self-aligned emitter may be grown by selective epitaxial growth in the trench as shown in FIG. 1T.

Figure 3:
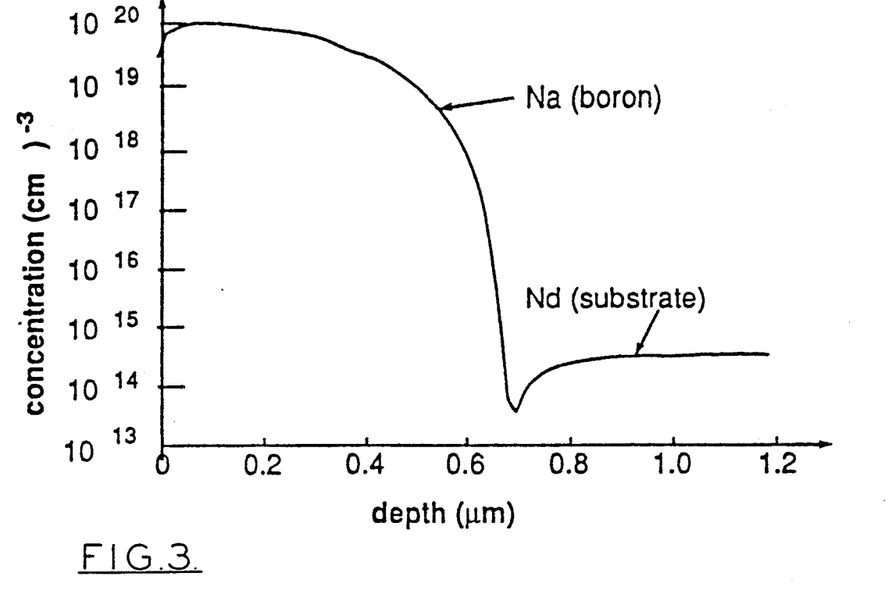
FIG. 3 is a spreading resistance profile of the base contact of FIG. 1.

After examination of the structure of FIG. 2, the sample was annealed at 1000° C. for fifteen minutes in nitrogen to simulate processing of the base contact. A spreading resistance profile of the base contact region 23 (FIG. 3) indicates that P type conductivity dominates throughout the entire base contact despite the presence of the phosphorus as a catalyst for impurity enhanced oxidation. A maximum P type doping concentration of about $1 \times 10^{20}/cm^3$ as well as a shallow junction depth of 680 nm were indicated. The fabricated base resistor structures were measured to have a sheet resistance of between 18.3 and 19Ω per square. Further process optimization may produce heavier P type doping and lower resistance. The sheet resistance of about 19Ω per square is about five times lower than may be conventionally obtained.

Figure 4:
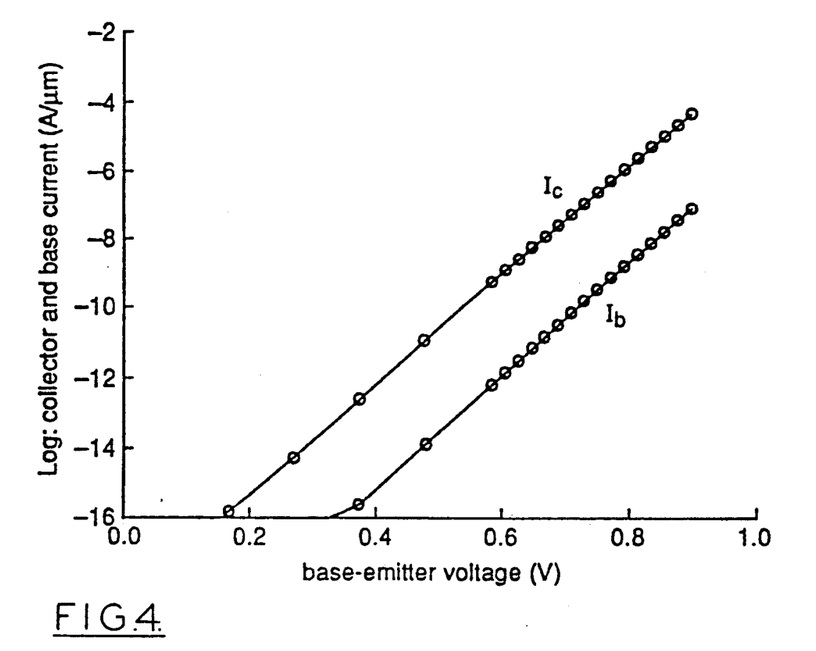
FIG. 4 is a graphical representation of the transistor parameters of the transistor of FIG. 1.

The structure of FIG. 1V was simulated using the PISCES IIb simulator. This simulator is described in a report entitled "PISCES--II Poisson and Continuity Equation Solver" by Pinto et al., Stanford University Report, 1984. A plot of base and collector current, $I_B$ and $I_C$, respectively, versus base-emitter voltage is shown in FIG. 4. The results indicate a forward current gain of over several hundred and good voltage/current characteristics throughout a wide range of voltages, and do not reveal any fabrication problems with the base-emitter diode due to the presence of phosphorus in the base contact. These results illustrate the advantages over polysilicon based high speed bipolar devices by dramatically reducing extrinsic base contact sheet resistance and by improving isolation and long term stability through growth of oxide from single crystal silicon.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming an integrated circuit bipolar transistor comprising the steps of:
   forming a monocrystalline mesa on a monocrystalline substrate, the mesa having a mesa wall rising above the monocrystalline substrate, and a mesa top surface;
   forming a plug on the mesa top surface, the plug covering a first portion of the mesa top surface and leaving a second portion of the mesa top surface exposed, the plug having a plug wall rising above the mesa top surface, and a plug top surface;
   forming a first insulating layer along the wall and on the substrate adjacent the mesa wall;
   forming a monocrystalline base contact from the second portion of the mesa top surface, having a base contact side extending along the plug wall and a base contact top surface extending along the mesa top and the first insulating layer;
   removing the plug to thereby expose the first portion of the mesa top and expose the base contact side;
   forming a second insulating layer along the base contact side and the base contact top, with the first portion of the mesa top remaining exposed; and,
   forming a second monocrystalline contact from the first portion of the mesa top, extending along the second insulating layer.

2. The method of claim 1 further comprising the step of forming a third monocrystalline contact from said monocrystalline substrate.

3. The method of claim 2 wherein the steps of forming the second monocrystalline contact and forming the third monocrystalline contact are performed simultaneously.

4. The method of claim 1 further comprising the step of forming electrodes on the first and second monocrystalline contacts.

5. The method of claim 1 wherein said forming a second monocrystalline contact step is preceded by the step of forming a base region in the mesa, through the first portion of the mesa top.

6. The method of claim 1 wherein the step of forming a second insulating layer comprises the steps of:
   oxidizing the base contact side, the base contact top and the exposed first portion of the mesa top, to form an oxide layer which is thinner on the mesa top than on the base contact top; and,
   directionally etching the oxide layer to remove the thinner oxide layer on the mesa top, with at least a portion of the oxide layer on the base contact top and side remaining.

7. The method of claim 6 wherein said removing the plug step is preceded by the step of doping the base contact top with a dopant that accelerates the formation of oxide on the base contact top.

8. The method of claim 7 wherein said doping the base contact top step comprises the step of performing a shallow phosphorus implant in the base contact top.

9. The method of claim 5 wherein the step of forming a second monocrystalline contact from the first portion of the mesa top is also preceded by the step of forming a region in the mesa, between the base region and the mesa top, of opposite conductivity from the base region.

10. The method of claim 1 wherein said step of forming a first insulator comprises the step of oxidizing the substrate and mesa wall.

11. The method of claim 1 wherein said step of forming a plug on the mesa top surface is preceded by the step of forming a barrier layer on the entire mesa top surface; and wherein the step of forming a monocrystalline base contact is preceded by the step of removing the barrier layer from the second portion of the mesa top surface.

12. A method of forming a monocrystalline base contact for an integrated circuit bipolar transistor comprising the steps of:
    forming a mesa on an integrated circuit substrate, the mesa having a mesa wall rising above the substrate, and a mesa top surface;
    forming a plug on the mesa top surface, the plug covering a first portion of the mesa top surface and leaving a second portion of the mesa top surface exposed, the plug having a plug wall rising above the mesa top surface; and a plug top surface;
    forming a first insulating layer on the mesa wall and on the substrate adjacent the mesa wall; and
    forming a monocrystalline base contact on the second portion of the mesa top surface, having a base contact side extending along the plug wall and a base contact top surface extending along the mesa top and the first insulating layer.

13. The method of claim 12 further comprising the step of:
    forming a second insulating layer along the base contact side and the base contact top.

14. The method of claim 13 wherein said step of forming a second insulating layer comprises the step of oxidizing the monocrystalline base contact side and the monocrystalline base contact top to form an oxide layer therefrom.

15. The method of claim 12 wherein said mesa forming step comprises the step of epitaxially forming a monocrystalline mesa on a monocrystalline substrate; and wherein the step of forming a first insulating layer comprises the step of oxidizing the monocrystalline substrate and mesa wall.

16. The method of claim 12 wherein said mesa forming step comprises the step of epitaxially forming a monocrystalline mesa on a monocrystalline substrate; and wherein said monocrystalline base contact forming step comprises the step of epitaxially forming a monocrystalline base contact from the second position of the mesa top surface.

* * * * *

UNITED STATES PATENT AND TRADEMARK OFFICE
CERTIFICATE OF CORRECTION

PATENT NO. : 5,118,634

DATED : June 2, 1992

INVENTOR(S) : Neudeck et al.

It is certified that error appears in the above-identified patent and that said Letters Patent is hereby corrected as shown below:

Column 1, line 33, "201" should be --20-1--

Column 10, line 28, "along the wall" should be --on the mesa wall--

Signed and Sealed this

Twenty-sixth Day of October, 1993

Attest:

BRUCE LEHMAN

Attesting Officer

Commissioner of Patents and Trademarks